US 8,456,866 B2

(12) United States Patent
Funaba et al.

(10) Patent No.: US 8,456,866 B2
(45) Date of Patent: Jun. 4, 2013

(54) POWER SUPPLY CIRCUIT AND POWER CONVERSION DEVICE

(75) Inventors: Seiji Funaba, Hitachinaka (JP); Yasuo Noto, Hitachinaka (JP); Masashige Tsuji, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 103 days.

(21) Appl. No.: 13/213,239

(22) Filed: Aug. 19, 2011

(65) Prior Publication Data

US 2012/0051099 A1 Mar. 1, 2012

(30) Foreign Application Priority Data

Aug. 31, 2010 (JP) ................................. 2010-193073

(51) Int. Cl.
*H02M 3/335* (2006.01)
(52) U.S. Cl.
USPC ............................................. 363/17; 363/98
(58) Field of Classification Search
USPC ................... 363/17, 40, 41, 98, 132
See application file for complete search history.

(56) References Cited

U.S. PATENT DOCUMENTS 7,656,690 B2 * 2/2010 Yamada et al. .............. 363/71
7,672,148 B2 * 3/2010 Shin et al. ...................... 363/98
7,729,146 B2 * 6/2010 Hayami et al. ................ 363/98
2007/0176575 A1 8/2007 Nawa et al.
2009/0001410 A1 1/2009 Shigeta et al.

FOREIGN PATENT DOCUMENTS

| JP | 2001-211661 A | 8/2001 |
| JP | 2004-357420 A | 12/2004 |
| JP | 2005-341695 A | 12/2005 |
| JP | 2007-202365 A | 8/2007 |
| JP | 2009-11013 A | 1/2009 |

OTHER PUBLICATIONS

Japanese Office Action with English Translation dated Jan. 15, 2013 (five (5) pages).

* cited by examiner

*Primary Examiner* — Jessica Han
(74) *Attorney, Agent, or Firm* — Crowell & Moring LLP

(57) ABSTRACT

A power conversion device includes an inverter circuit converting DC power into AC power and including switching devices constituting upper and lower arms, a control circuit controlling the switching devices, a drive circuit driving the switching devices by a signal from the control circuit, and an insulated power supply circuit supplying power to the drive circuit. The control circuit controls a power supply voltage to be outputted from the power supply circuit to the drive circuit. The drive circuit drives the switching devices and based on a carrier frequency and the power supply voltage. The power supply circuit includes a feedback output circuit through which the voltage outputted to the drive circuit is outputted to a power supply control IC. The feedback output circuit includes a dummy load circuit which controls the voltage to be outputted to the power supply control IC based on a change of the carrier frequency.

13 Claims, 13 Drawing Sheets

BUFFER CIRCUIT

FIRST EMBODIMENT OF THE INVENTION

INVERTER CIRCUIT

DUMMY LOAD CIRCUIT

GATE DRIVE CIRCUIT

CARRIER FREQUENCY DEPENDENCY OF
POWER SUPPLY VOLTAGE IN PRIOR-ART EXAMPLE

CARRIER FREQUENCY DEPENDENCY OF
POWER SUPPLY VOLTAGE ACCORDING TO THE INVENTION

DUMMY LOAD CIRCUIT

DUMMY LOAD CIRCUIT

FOURTH EMBODIMENT ACCORDING TO THE INVENTION

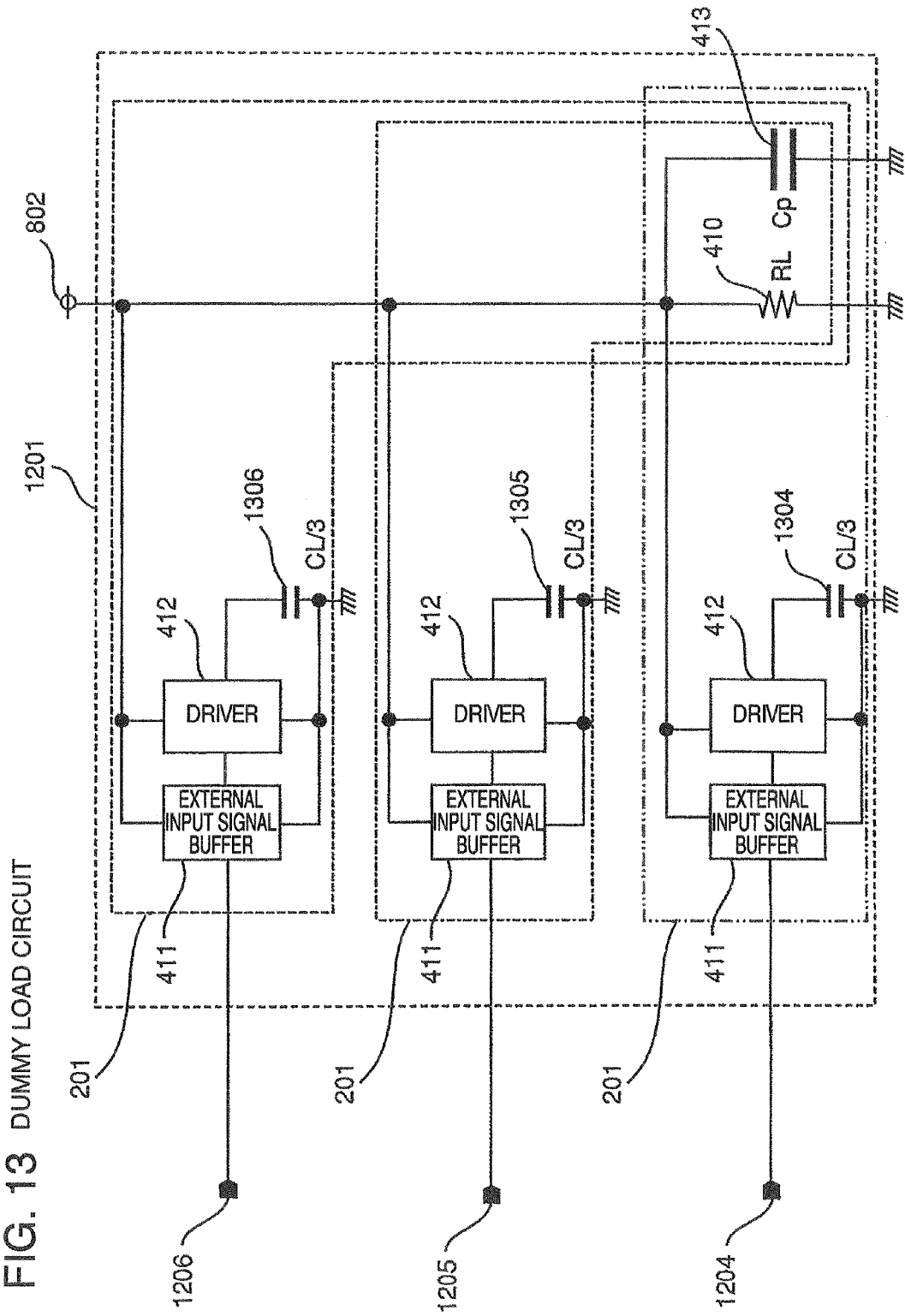
FIG. 13 DUMMY LOAD CIRCUIT

POWER SUPPLY CIRCUIT AND POWER CONVERSION DEVICE

BACKGROUND OF THE INVENTION

The present invention relates to a power supply circuit and a power conversion device for a hybrid car or an electric car.

With increase in the switching speed of a switching device formed as a constituent member of an inverter, the switching loss is reduced, but surge is apt to occur in the collector-emitter voltage of the switching device. In this case, there is a problem that the switching device may be damaged when the voltage is beyond its rated voltage. On the other hand, when the switching speed is slow, surge hardly occurs, but the switching loss of the switching device is large to cause deterioration of the energy efficiency. In addition, when the switching speed is slow, the junction temperature is apt to increase so that the switching device may be damaged when the temperature is beyond its rated temperature.

A gate drive circuit needs to be designed to optimize these trade-offs. It is desirable that a gate voltage does not fluctuate. In order to keep the gate voltage constant, it is necessary to make the output voltage of a power supply circuit not to fluctuate.

In a background-art power supply circuit, with increase in the carrier frequency (switching frequency) of a gate drive circuit, a current with which the capacity in the gate of a switching device is charged/discharged increases to increase power consumption in the gate. On the other hand, a feedback output circuit does not respond to the carrier frequency fc as the gate drive circuit does. As a result, in spite of the increase of power consumption in the power supply circuit, there is no change in an output voltage 601 of the feedback output circuit as represented in FIG. 6. Thus, the electric power supplied to the gate drive circuit is kept constant in spite of the fluctuation of the carrier frequency fc. Even if the power supplied to the gate drive circuit is constant, the power consumption of the gate drive circuit increases. Thus, the power supply voltage drops down as represented in the power supply voltage Vcc of a secondary output circuit in FIG. 6.

As a result, the gate voltage of the switching device is lower than that in the optimized design condition. Thus, there arises a problem that the energy efficiency deteriorates due to the increase in switching loss.

JP-A-2005-341695 discloses an invention of a power supply circuit in which a dummy load circuit provided in an output circuit is turned ON in response to a decrease in a load of the output circuit so as to suppress an increase in an output voltage by increasing the load.

The power supply circuit disclosed in JP-A-2005-341695 indeed takes measures to solve the problem that the output voltage of the output circuit increases when the load of the output circuit decreases, however, there is no consideration for the problem that the output voltage of the output circuit decreases when the load of the output circuit increases.

SUMMARY OF THE INVENTION

In consideration of the aforementioned problem, an object of the invention is to provide a power conversion device which can suppress the decrease of output voltage even when the carrier frequency increases.

The power conversion device according to the invention includes an inverter circuit which converts DC power into AC power, and further includes a plurality of switching devices constituting upper and lower arms, a control circuit which controls the switching devices, a drive circuit which drives the switching devices based on a signal from the control circuit, and an insulated power supply circuit which supplies power to the drive circuit, wherein the control circuit controls a power supply voltage to be outputted from the power supply circuit to the drive circuit, the drive circuit drives the switching devices based on a carrier frequency and the power supply voltage, the power supply circuit includes a feedback output circuit through which the voltage outputted to the drive circuit is outputted to a power supply control IC, and the feedback output circuit includes a dummy load circuit which controls the voltage to be outputted to the power supply control IC based on a change of the carrier frequency.

It is possible to provide a power conversion device which can suppress a decrease of the output voltage to the gate even if the carrier frequency increases.

Other objects, features and advantages of the invention will become apparent from the following description of the embodiments of the invention taken in conjunction with the accompanying drawings.

BRIEF DESCRIPTION OF THE DRAWINGS

FIG. 13 is a circuit diagram of a dummy load circuit according to the fourth embodiment of the invention.

DETAILED DESCRIPTION OF THE EMBODIMENTS

In addition to the contents of the aforementioned "SUMMARY OF THE INVENTION", the following embodiments can attain desired objects for commercialization as products and obtain preferable effects on commercialization as products. Some of them will be described below, and specific solutions to the problem and specific effects will be described in "DETAILED DESCRIPTION OF THE EMBODIMENTS".

First Embodiment

Figure 2:
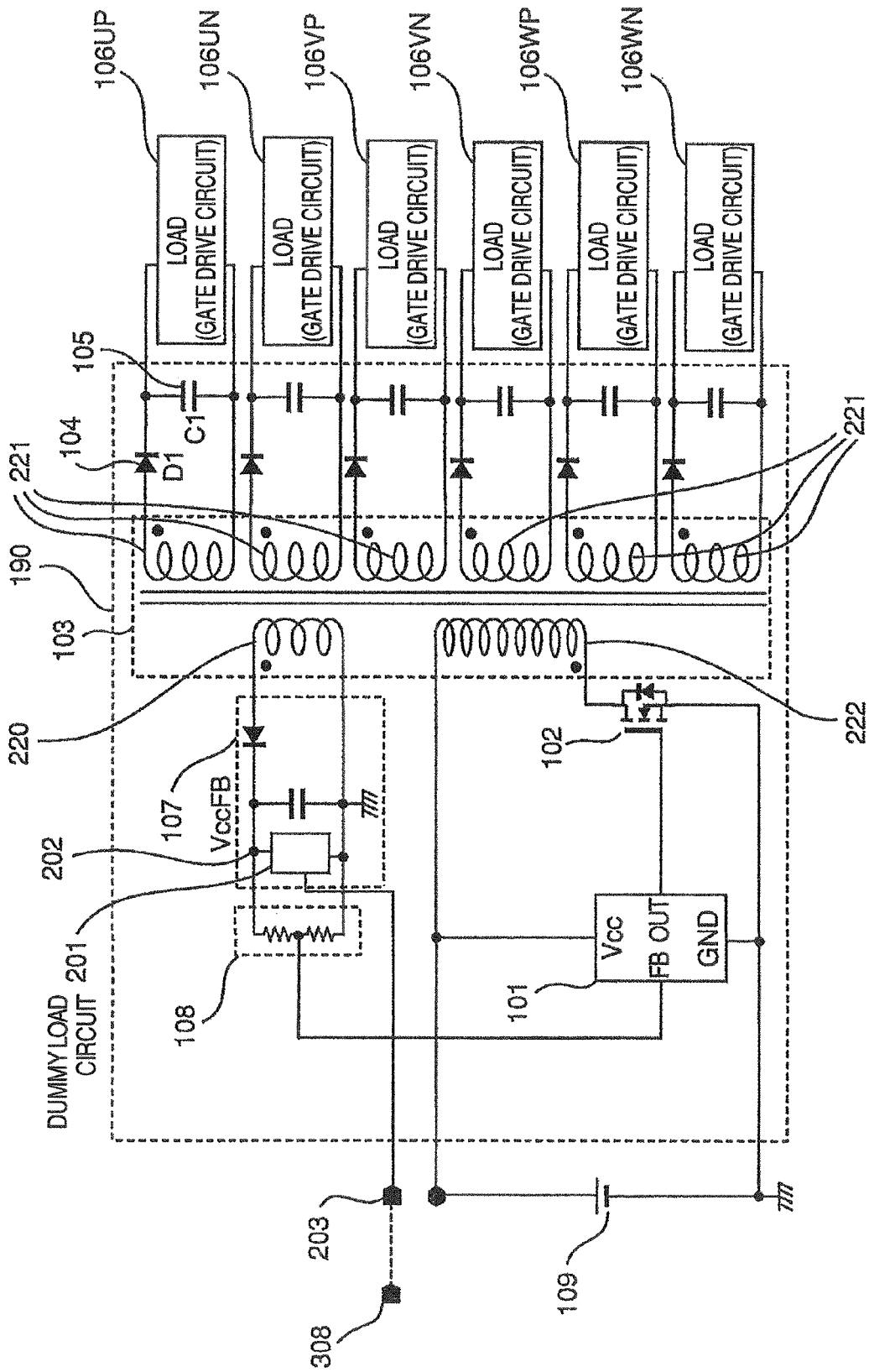
FIG. 2 is a circuit diagram of a power supply circuit according to a first embodiment of the invention.

A first embodiment of the invention will be described with reference to FIG. 2. FIG. 2 represents a power supply circuit for gate drive circuits. The power supply circuit is a flyback type circuit. The power supply circuit has a transformer 103 for insulating outputs. The transformer 103 has one primary coil 222 and seven secondary coils 220 and 221. One of the secondary coils is a dummy coil 220 for feeding back a power supply voltage, and the other six 221 provide power to gate drive circuits 106. A power supply control IC 101 and a transformer driving MOSFET 102 are located on the primary side of the transformer. The primary coil is connected to a battery 109 outside an inverter through a motor control board. The power supply control IC 101 outputs a PWM signal to the gate of the MOSFET 102 so as to switch a primary current of the transformer 103. On that occasion, the primary current of the transformer 103 can be changed in accordance with the duty ratio of the PWM signal so as to change the power to be transmitted from the battery 109 to the secondary side. The reference potential of the battery 109 is set at a body of a vehicle. The reference potential of the battery 109 is different from the reference potential of a high-voltage DC power supply 306 which supplies power to a motor. Each secondary coil includes a rectifier diode 104 and a capacitor 105. An output appears between the terminals of the capacitor. To the output, gate drive circuits, 106UP, 106UN, 106VP, 106VN, 106WP, 106WN (hereinafter referred to as gate drive circuit 106) corresponding to each of the gate of the secondary coil are connected as a load. A total of six circuits like this correspond to upper and lower arms of three phases. Here, a power supply circuit 190 shown in FIG. 3 uses the battery 109 as a power supply, and the reference potential of the power supply circuit 190 is set at the vehicle body. It is therefore necessary to insulate the power supply circuit 190 from the reference potential of each secondary output circuit. Thus, the voltage of the output circuit cannot be fed back directly. For this reason, a seventh secondary output circuit whose reference potential is equal to the reference potential of the battery 109 is prepared separately as a feedback output circuit 107. The feedback output circuit 107 also includes a rectifier diode and a capacitor in the same manner as the other secondary output circuits. In addition, the secondary coil of the feedback output circuit has the same number of turns as any other secondary coil. When the coupling between the coils in the transformer is enough dense, an output voltage equal to that in any other secondary circuit appears in the feedback output circuit 107. The feedback output circuit 107 is provided with a voltage divider circuit 108 for dividing the output voltage of the feedback output circuit 107 to a predetermined voltage. Here, the voltage divider circuit feeds an output voltage signal back to the power supply control IC 101. Then, the power supply control IC 101 detects the output voltage of the feedback output circuit of the power supply circuit and adjusts the duty ratio of the PWM output signal for switching the transformer driving MOSFET 102 so as to set the output voltage of the feedback output circuit at a predetermined voltage (15 V). The feedback output circuit 107 is provided with a dummy load circuit 201. The dummy load circuit 201 has an external input signal terminal 203. The dummy load circuit 201 is connected between an output 202 of the feedback output circuit and the ground. The external input signal terminal 203 is connected to a U-phase lower arm gate signal wire 308. Although the external input signal terminal 203 is connected to the U-phase lower arm gate signal wire 308 by way of example here, the external input signal terminal 203 may be connected to any other gate signal wire.

(Inverter)

An inverter (power conversion device) for driving a motor of a hybrid car has a function by which DC power supplied from a DC power supply can be converted into AC power to be supplied to an AC electric load such as a rotary electric machine, or a function by which AC power generated by the rotary electric machine can be converted into DC power to be supplied to the DC power supply. To obtain the conversion function, the inverter includes switching devices such as MOSFETs or IGBTs. Each of the switching devices is turned ON/OFF repeatedly to perform the power conversion from DC power to AC power or from AC power to DC power.

Figure 3:
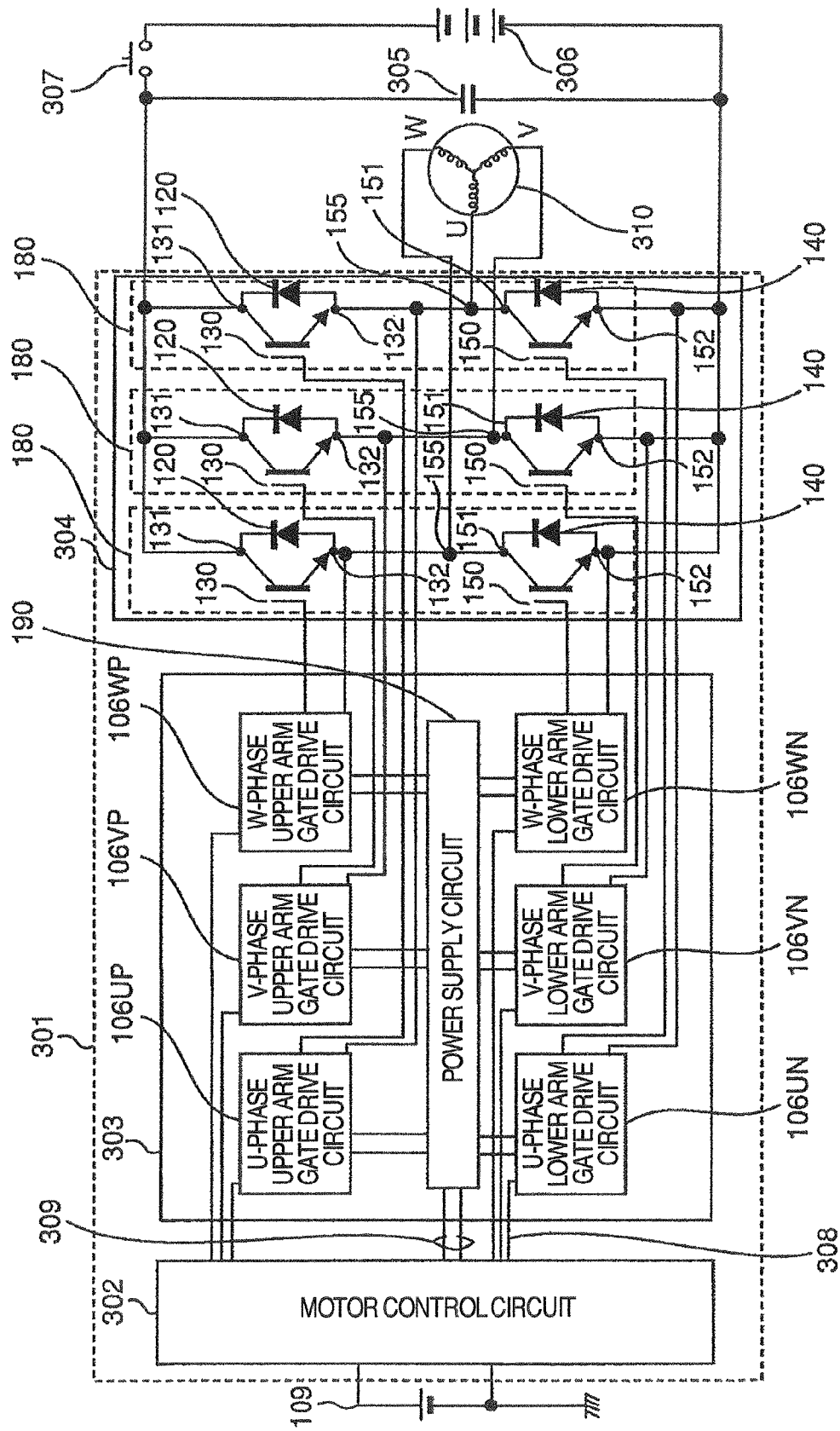
FIG. 3 is a diagram representing an example of an electric circuit configuration of an inverter for driving a three-phase motor.

An example of an electric circuit structure of the hybrid car motor driving inverter will be described with reference to FIG. 3. An inverter 301 is constituted by a motor control board 302, a gate drive board 303, and a power module 304 with switching devices. The power module 304 includes arms in each of which an IGBT 130, 150 and a diode 120, 140 are electrically connected in parallel. Of the arms, the arm which is disposed on the positive electrode side of a high-voltage DC power supply is called an upper arm, and the arm which is disposed on the negative electrode side of the high-voltage DC power supply is called a lower arm. A series circuit 180 is a circuit in which an emitter electrode 132 of the IGBT forming the upper arm and a collector electrode 152 of the IGBT forming the lower arm are electrically connected in series. The series circuit 180 has an intermediate output terminal 155 for outputting power to a motor 310. When the inverter drives a three-phase motor, the inverter must have three outputs. Thus, three series circuits 180 each having a pair of upper and lower arms of switching devices are built in the inverter. In addition, in the gate drive board 303, gate drive circuits are prepared for the IGBTs 130 and IGBTs 150 of the three pairs of upper and lower arms respectively. That is, a total of six gate drive circuits 106 are provided in the gate drive board 303. A total of six gate signal wires including a power supply line 309 and a gate signal wire 308 leading to the U-phase lower arm gate drive circuit 106UN are connected between the motor control board 302 and the gate drive board 303.

The following should be noted here. That is, the motor control board 302 and each gate drive circuit 106 in the gate drive board 303 have different reference potentials. There are generally two kinds of external power supplies for the hybrid car motor driving inverter. One is a normal 12 V power supply for vehicles and the other is the high-voltage power supply 306 for driving the motor. Here, the 12 V power supply is used for a control circuit, and the reference potential of the 12 V power supply is set at the body of the vehicle. On the other hand, the high-voltage power supply 306 for driving the motor is fed to the IGBTs 130 and 150, and the reference potential of the high-voltage power supply 306 is not always set at the vehicle body, but the intermediate potential between the positive electrode potential and the negative electrode potential of the high-voltage power supply may be set at the vehicle body. In this embodiment, the 12 V power supply for vehicle is used for the motor control board 302, and the reference potential of the 12V power supply is set at the vehicle body. On the other hand, the reference potential of each of the gate drive circuits 106UP, 106VP and 106WP for the upper arms is equal to the potential of the emitter electrode 132 of the IGBT 130 corresponding to each of the gate drive circuits 106UP, 106VP and 106WP, that is, the potential of the intermediate output terminal of the inverter. The reference potential of each of the gate drive circuits 106UN, 106VN and 106WN for the lower arms is equal to the potential of the emitter electrode 152 of the IGBT 150 corresponding to each of the gate drive circuits 106UN, 106VN and 106WN, that is, the negative-electrode-side potential of the high-voltage DC power supply 306.

As for the operation of the inverter, first, the motor control board 302 transmits PWM gate signals to the six gate drive circuits 106 of the gate drive board 303 in order to switch the IGBTs 130 and 150. Here, due to the difference in reference potential between the motor control board 302 and the gate drive board 303, the signals are transmitted and received through insulated signal transmission units such as photocouplers. Next, each gate drive circuit 106 applies a voltage between the gate terminal and the emitter terminal of the IGBT 130, 150 based on the gate signal, so as to switch the IGBT 130, 150. Thus, the IGBTs 130 and 150 apply a current to the motor 310 so that the motor 310 is driven.

(Gate Drive Circuit)

Figure 5:
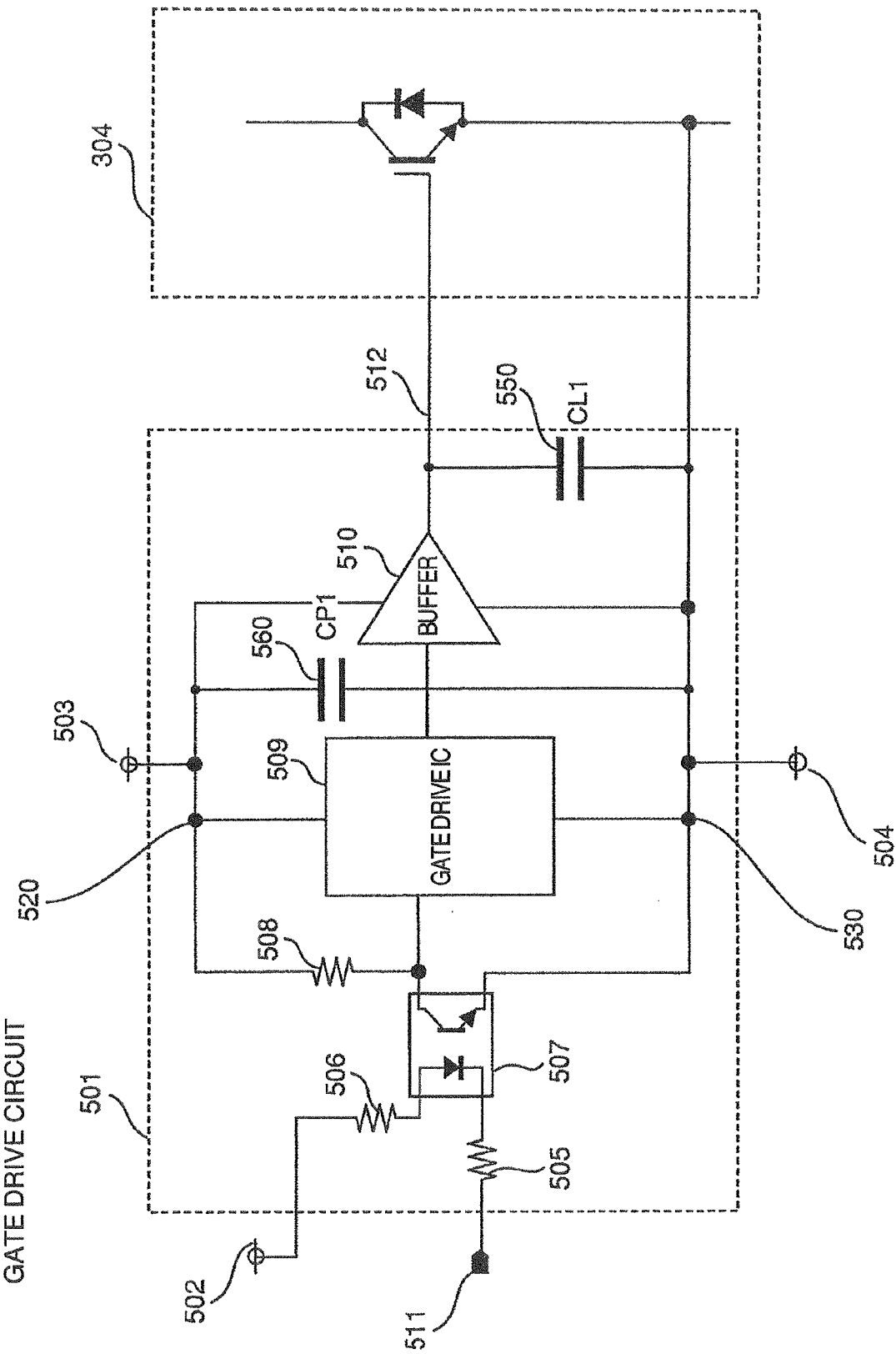
FIG. 5 is a circuit diagram representing a configuration example of a gate drive circuit.
Figure 6:
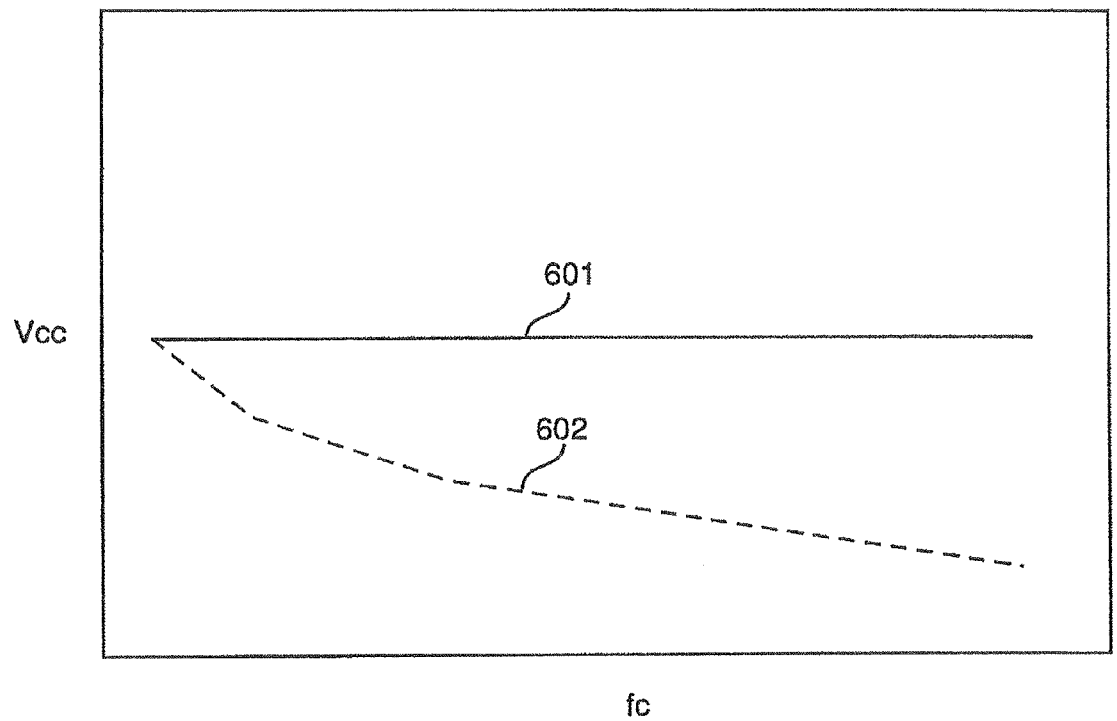
FIG. 6 is a graph representing a carrier frequency dependency of a power supply voltage in a power supply circuit according to an example of the prior art.

FIG. 5 represents a block diagram illustrating one gate drive circuit 106 by way of example. A gate driver circuit 501 is chiefly constituted by a photo-coupler 507, a gate drive IC 509, a buffer circuit 510, a power supply bypass capacitor 560 connected in parallel with the gate drive IC 509 and the buffer circuit 510, and a capacitor 550 connected in parallel with the gate terminal and the emitter terminal of the IGBT 130, 150.

The gate signal is inputted from the motor control board 302 to the gate drive IC 509 through the photo-coupler 507. The gate signal inputted from the motor control board 302 has a signal level of 5 V with a reference potential set at the vehicle body. On the other hand, the gate drive circuit 106 has a different reference potential, and the signal level of the gate drive circuit 106 is 15 V, which is higher than the gate threshold voltage of the IGBT driving a high current. That is, the photo-coupler 507 also has a role of signal level conversion as well as a role of insulated signal transmission. Based on the signal, the gate drive IC 509 applies a gate-emitter voltage to the IGBT 130, 150 through the buffer circuit 510.

(Buffer Circuit)

Figure 1:
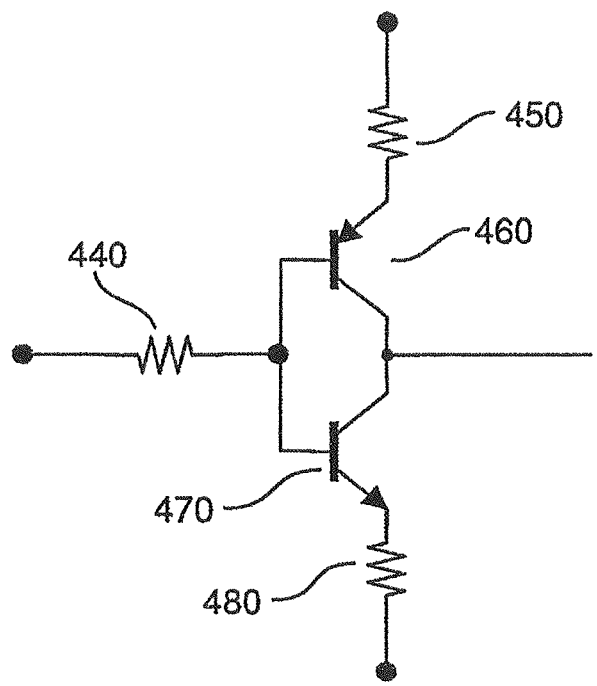
FIG. 1 is a circuit diagram of a buffer circuit according to the invention.

The buffer circuit 510 has a configuration in which a resistance 450, an IGBT 460, an IGBT 470 and a resistance 480 are connected in series as represented in FIG. 1. A gate resistance 440 is electrically connected to the gates of the IGBT 460 and the IGBT 470.

(Dummy Load Circuit)

Figure 4:
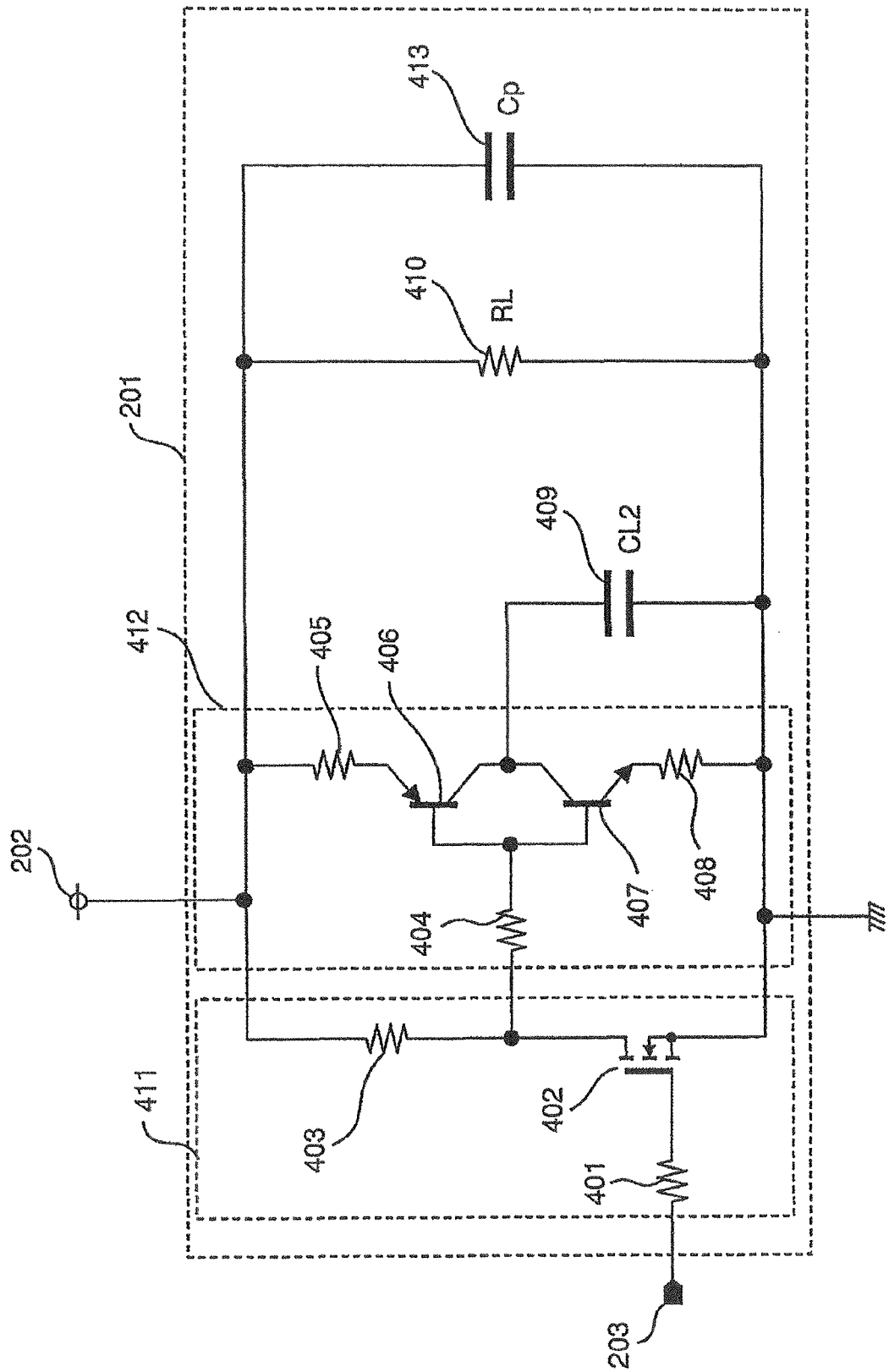
FIG. 4 is a circuit diagram of a dummy load circuit according to the first embodiment of the invention.

The dummy load circuit 201 will be described with reference to FIG. 4. The circuit is constituted by an external input signal buffer 411, a driver 412, a load capacitance 409, and a load resistance 410. A power supply terminal and a ground terminal of the dummy load circuit 201 are connected to the output 202 of the feedback output circuit and the ground respectively. A bypass capacitor 413 corresponds to the power supply bypass capacitor 560 of the gate drive circuit 106. It is desirable that the bypass capacitor 413 is provided to have the same capacitance as that of the power supply bypass capacitor 560 placed in the gate drive circuit 106.

The external input signal buffer 411 converts the signal level of the gate signal from 5 V to 15 V. The external input signal buffer 411 serves as a signal inverting circuit, which is constituted by a MOSFET 402, a gate resistance 401, and a resistance 403 pulled up to the output 202 of the feedback output circuit. The gate signal of 5 V from the motor control board 302 is supplied to the gate terminal of the MOSFET 402 through the gate resistance 401. Then, the external input signal buffer 411 outputs an inversion signal of 15 V to the driver 412 located in the next stage.

The driver 412 obtains power supply from the output 202 of the feedback output circuit so as to charge/discharge the load capacitance 409 with the frequency of the gate signal. The driver 412 serves as a non-inversion buffer circuit, which is constituted by an input resistance 404, a high-potential-side output resistance 405, a PNP bipolar transistor 406, an NPN bipolar transistor 407, and a low-potential-side output resistance 408.

The load capacitance 409 has a capacitance value CL2 which is equal to that of the load capacitance of the gate drive circuit, that is, the total sum of the gate capacitance of the IGBT 130, 150 of the IGBT module 304 and the capacitance existing in the gate drive circuit 106. As a method for deciding the capacitance value specifically, the capacitance value CL2 may be set as CL2=QG/VG+C0, where QG designates the gate accumulated charge of the IGBT 130, 150 and VG designates the gate voltage of the same. Here, C0 designates the total capacitance of capacitive loads charged/discharged with the power supply voltage other than the output load in the gate drive circuit. In addition, it is more preferable that the carrier frequency dependency of the power supply voltage of the gate drive circuit 106 is actually measured and the capacitance value CL2 is adjusted experimentally to make the output voltage of the feedback output circuit agree with the carrier frequency dependency of the power supply voltage. As another method for deciding the load capacitance 409 than the aforementioned method, a capacitance similar to the load capacitance 550 used in the gate drive circuit 106 as represented in FIG. 5 may be used.

The load resistance 410 simulates a DC current load of the gate drive circuit 106. The load resistance 410 has a resistance value RL which allows a flow of current equal to a DC component of the current consumed by the gate drive circuit 106. Specifically, it is desirable that the resistance value RL is a resistance value between a gate drive IC positive electrode connection point 520 and a gate drive IC negative electrode connection point 530 in the gate drive IC 509 as represented in FIG. 5. In addition, it is more preferable that the power supply voltage between the gate drive IC positive electrode connection point 520 and the gate drive IC negative electrode connection point 530 at a carrier frequency of 0 Hz is actually measured and the resistance value RL is experimentally adjusted to make the output voltage of the feedback output circuit agree with the carrier frequency dependency of the power supply voltage.

When a real gate drive circuit 106 is used in the external input signal buffer 411 and the driver 412 of the dummy load circuit 201, the frequency response of each actual gate drive circuit can be simulated to improve the accuracy of feedback further.

With this configuration, in the dummy load circuit 201, the driver 412 obtains power supply from the output 202 of the feedback output circuit in accordance with the gate signal from the motor control board 302, so as to charge/discharge the same load capacitance as that of the gate drive circuit 106 at the carrier frequency. The load resistance 410 obtains power supply from the output 202 of the feedback output circuit and allows a flow of the same current as the current flowing in the gate drive IC 509. Thus, a similar load to that of the gate drive circuit 106 can be reproduced in the feedback output circuit of the power supply circuit independently of the carrier frequency.

Figure 7:
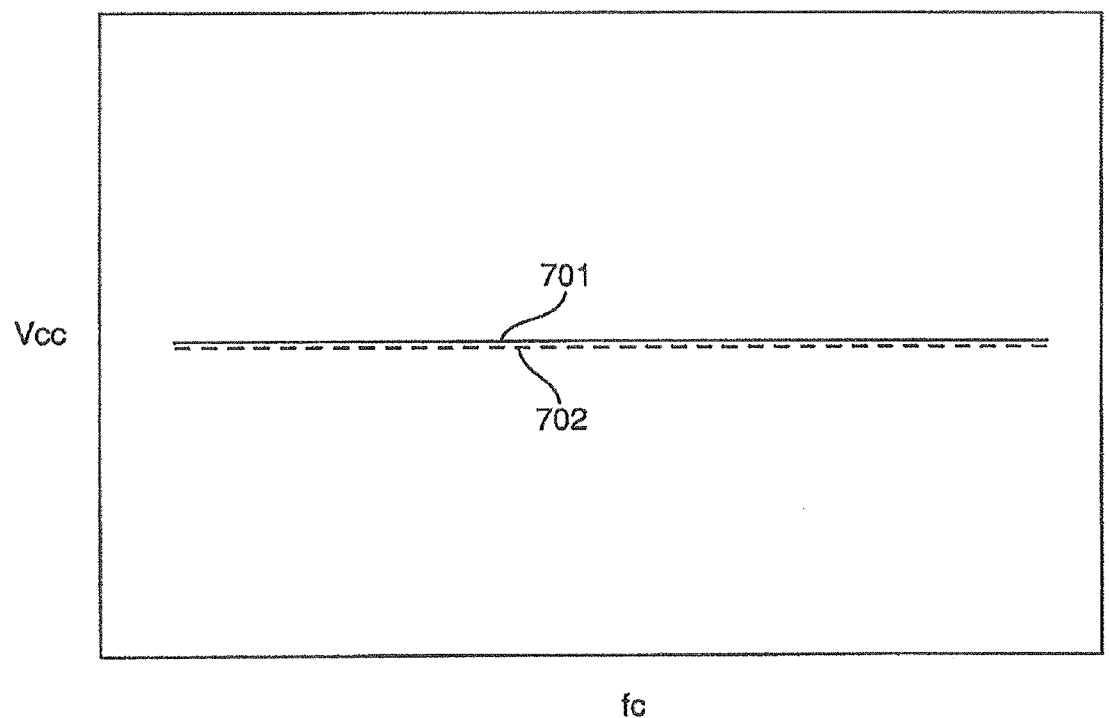
FIG. 7 is a graph representing a carrier frequency dependency of a power supply voltage in a power supply circuit according to the invention.

Based on the aforementioned contents, the load of the feedback output circuit may follow an actual load even when the carrier frequency increases to increase the load of the output circuit of the power supply circuit 190. Since the load of the feedback output circuit may follow the actual load, a power supply voltage Vcc 702 of a secondary-side output circuit becomes substantially constant even when the carrier frequency fc increases, as represented in the graph of FIG. 7. Thus, the output voltage drop, that is, the gate voltage drop of each switching device can be suppressed when the carrier frequency increases, so that it is possible to suppress deterioration of power efficiency in the inverter.

Second Embodiment

Power Supply Circuit

Figure 8:
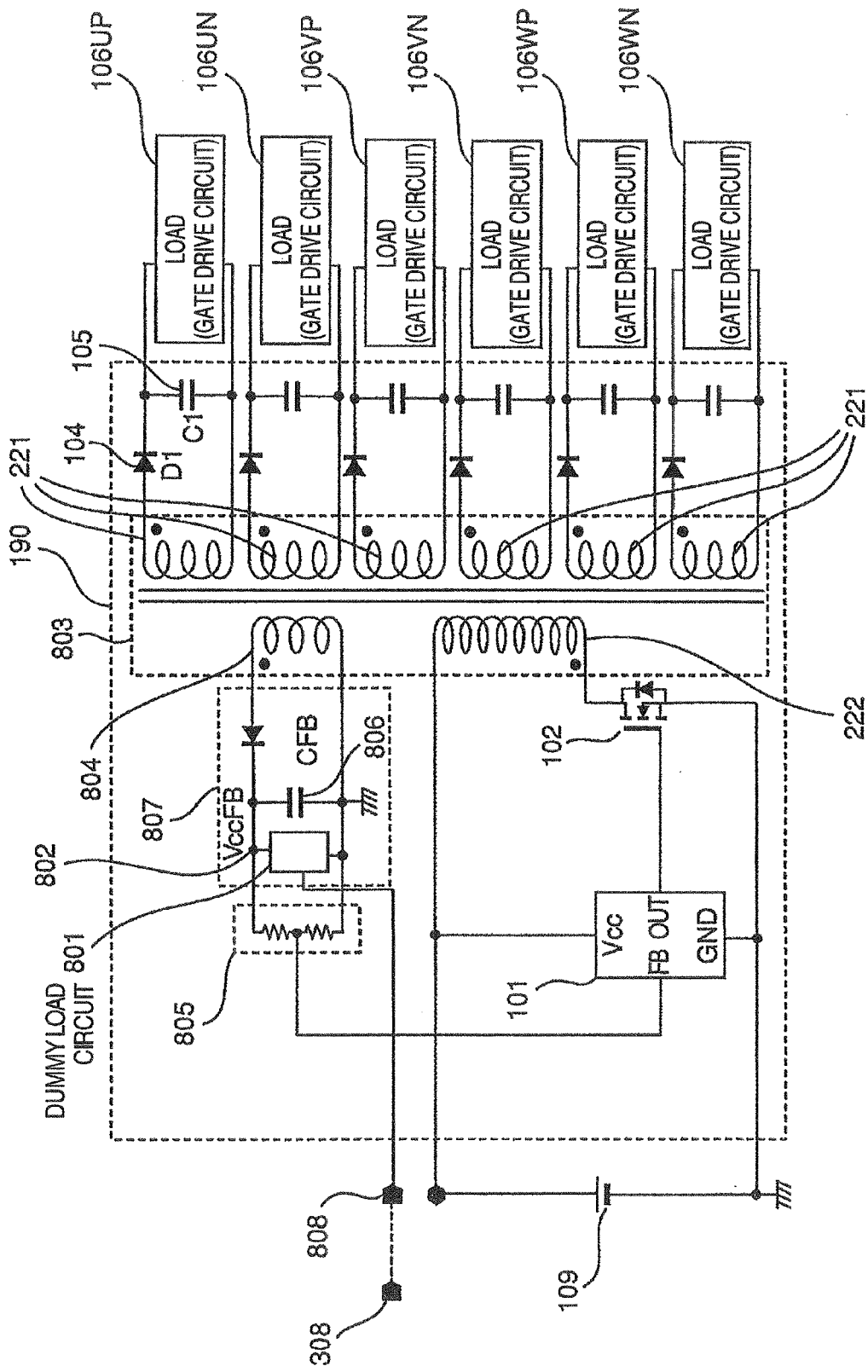
FIG. 8 is a circuit diagram of a power supply circuit according to a second embodiment of the invention.

A second embodiment of the invention will be described with reference to FIG. 8. This power supply circuit 190 has almost the same configuration as the power supply circuit described in the first embodiment. In the first embodiment, power is also supplied to the dummy load circuit so that the power is also consumed in the dummy load circuit. However, since it works out as long as the dummy load circuit can output a feedback output voltage high enough to prevent the output voltage drop of each gate drive circuit 106, it is therefore desirable that the power consumption in the dummy load circuit is suppressed. To this end, this embodiment differs from the first embodiment as follows. That is, the number of turns of a feedback coil 804 of a transformer 803 is reduced to ⅓ of the number of turns of any other secondary coil so as to make the voltage division ratio of a voltage divider circuit 805 three times as high as its original one. That is, the output voltage is made ⅓ (i.e. from 15 V to 5 V). With the aforementioned configuration, the voltage outputted to the dummy load circuit 801 can be reduced to suppress the power consumption in the dummy load circuit. The dummy load circuit 801 has an external input signal terminal 808. The dummy load circuit 801 is connected between an output 802 of the feedback output circuit and the ground. The external input signal terminal 808 is connected to a U-phase lower arm gate signal wire 308. Although the external input signal terminal 808 is connected to the U-phase lower arm gate signal wire 308 by way of example here, the external input signal terminal 808 may be connected to any other gate signal wire.
(Dummy Load Circuit)

Figure 9:
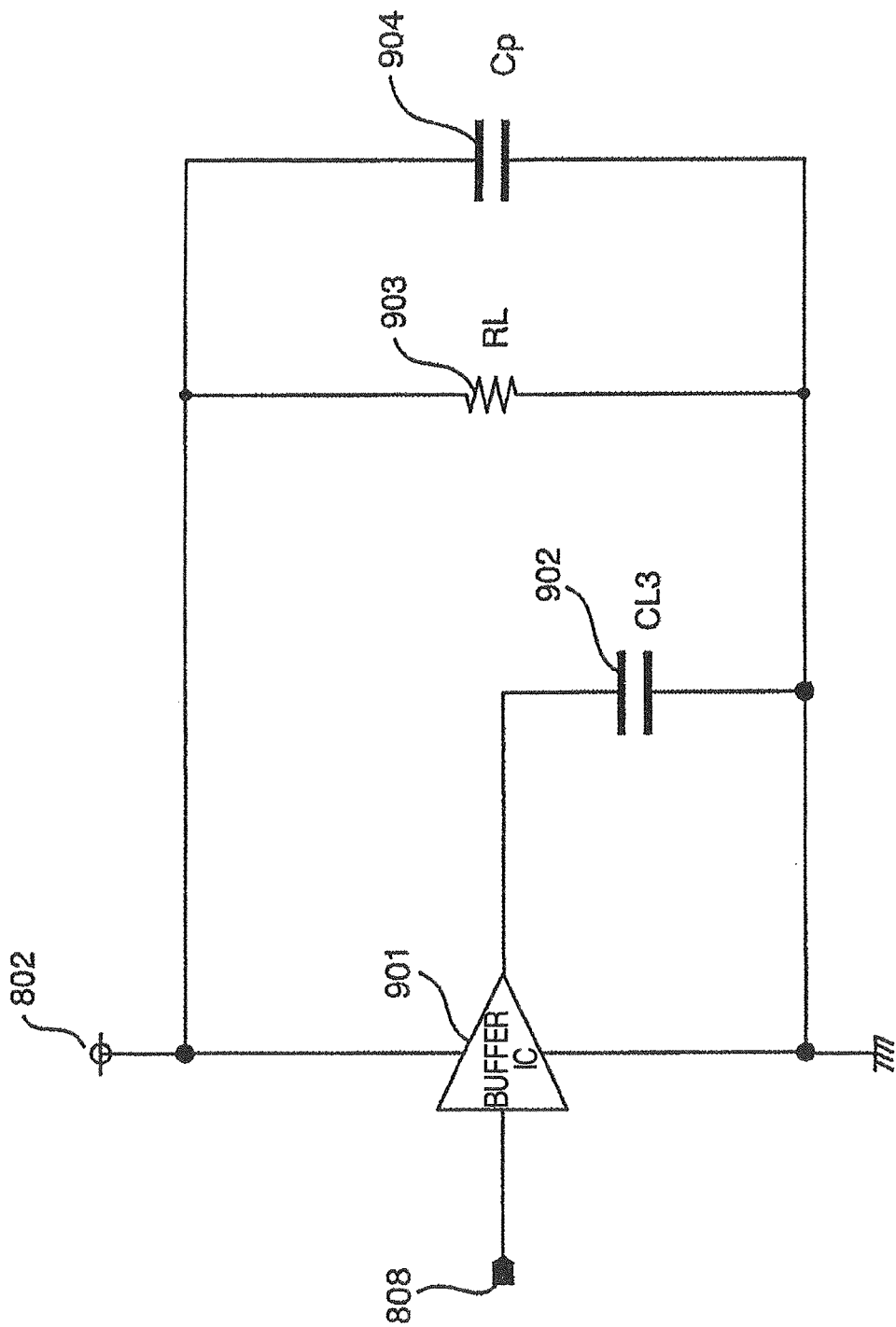
FIG. 9 is a circuit diagram of a dummy load circuit according to the second embodiment of the invention.

The dummy load circuit 801 in the second embodiment will be described with reference to FIG. 9. The circuit is constituted by a buffer IC 901, a load capacitance 902 and a load resistance 903. A power supply terminal and a ground terminal of the circuit are connected to the output 802 of the feedback output circuit and the ground respectively. A bypass capacitor 904 simulates the power supply bypass capacitor 560 connected in parallel with the gate drive circuit 106 so that it is desirable that the bypass capacitor 904 is provided to have the same capacitance as that of the power supply bypass capacitor 560 placed in the gate drive circuit 106.

The buffer IC 901 obtains a 5 V supply from the output 802 of the feedback output circuit so that the gate signal from the motor control board 302 can be inputted directly with a signal level of 5 V so as to charge/discharge the load capacitance 902 with the frequency of the gate signal.

The load capacitance 902 is decided in the same manner as in the aforementioned first embodiment.

The load resistance 903 simulates a DC current load of the gate drive circuit 106. The load resistance 903 has a resistance value RL which allows a flow of current corresponding to ⅓ of a DC component of the current consumed by the gate drive circuit. Specifically, it is desirable that the resistance value RL is three times as large as the resistance value between the gate drive IC positive electrode connection point 520 and the gate drive IC negative electrode connection point 530 in the gate drive IC 509 as represented in FIG. 5. In addition, it is more preferable that the power supply voltage between the gate drive IC positive electrode connection point 520 and the gate drive IC negative electrode connection point 530 at a carrier frequency of 0 Hz is actually measured, and the resistance value RL is experimentally adjusted to make the output voltage of the feedback output circuit agree with the carrier frequency dependency of the power supply voltage.

With this configuration, in the dummy load circuit 801, the buffer IC 901 obtains a power supply from the output 802 of the feedback output circuit in accordance with the gate signal from the motor control board 302, so as to charge/discharge the same load capacitance as that of the gate drive circuit at the carrier frequency and the voltage which is ⅓ as large as the power supply voltage of the gate drive circuit. The load resistance 903 obtains a power supply from the output 802 of the feedback output circuit to allow a flow of current corresponding to ⅓ of the DC component of the current consumed in the gate drive IC 509. Thus, in the feedback output circuit whose output voltage is scaled down to ⅓ of the power supply voltage of the gate drive circuit 106, a load which is ⅓ as large as the load of the gate drive circuit 106 can be reproduced irrespective of the carrier frequency. In addition, when the output voltage is scaled down to ⅓ of the output voltage of the gate drive circuit 106, the buffer 411 can be dispensed with, and as a result, the dummy load circuit can be miniaturized. In order to obtain an effect merely to suppress the power consumption, the number of turns of the feedback coil 804 may be reduced to 1/N as large as the number of turns of any other secondary coil, so as to make the voltage division ratio of the voltage divider circuit 805 N times as high as its original one.

Based on the aforementioned contents, the load of the feedback output circuit may follow an actual load even when the carrier frequency increases and the load of the output circuit of the power supply circuit 190 increases. Since the load of the feedback output circuit may follow the actual load, a power supply voltage Vcc 702 of a secondary-side output circuit becomes substantially constant even when the carrier frequency fc increases, as represented in the graph of FIG. 7. Thus, the output voltage drop, that is, the gate voltage drop of each switching device can be suppressed when the carrier frequency increases, so that it is possible to suppress deterioration of power efficiency in the inverter. Further, when the output voltage of the feedback output circuit is made as high as the gate signal voltage of the motor control board 302, the buffer 411 shown in the first embodiment can be dispensed with. Thus, the dummy load circuit 801 can be simplified so that miniaturization and low cost can be achieved. In addition, the voltage outputted to the dummy load circuit 801 is reduced so that the power consumed by the dummy load circuit 801 can be reduced to improve the efficiency of the power supply circuit.

Third Embodiment

Power Supply Circuit

Figure 10:
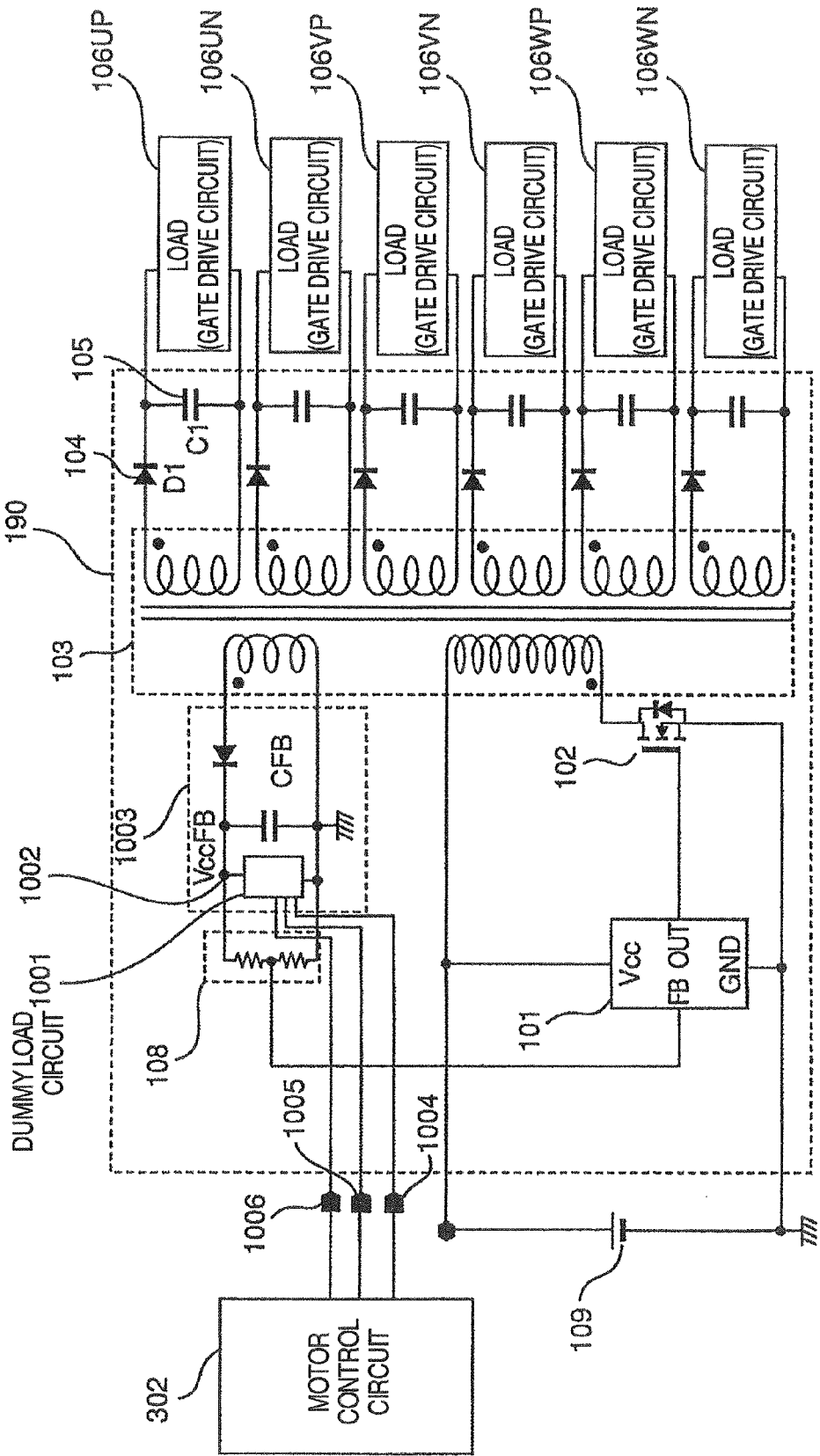
FIG. 10 is a circuit diagram of a power supply circuit according to a third embodiment of the invention.

A third embodiment of the invention will be described with reference to FIG. 10. A power supply circuit in this embodiment is substantially the same as the power supply circuit described in the first embodiment. In the first and second embodiments, a gate signal to be outputted to one upper arm or one lower arm is supplied to the dummy load circuit. However, when the control system of the inverter 301 is changed to a two-phase modulation system, there is a fear that feedback cannot be performed due to use of a signal of one phase which is not operative. Accordingly, in the third embodiment, three signal terminals 1004, 1005 and 1006 connected to the motor control board 302 are provided between an output node 1002 of a feedback output circuit 1003 and the ground. Thus, signals based on gate signal information, for example, carrier frequency information can be outputted directly to a dummy load circuit 1001 so as to improve the reliability of control.

Assume that fcmax designates the highest one of the carrier frequencies fc, f0 designates a frequency which is representative of a low band expressed by f0=¼×fcmax, f1 designates a frequency which is representative of a middle band expressed by f1=½×fcmax, and f2 designates a frequency which is representative of a high band expressed by f2=¾×fcmax. Of the signals based on the carrier frequency information, the signal to be inputted to the signal terminal 1004 becomes a "H" level (5 V) when the carrier frequency fc is higher than the frequency f0, while the signal becomes a "L" level (0 V) when the carrier frequency fc is lower than the frequency f0. The signal to be inputted to the signal terminal 1005 becomes the "H" level (5 V) when the carrier frequency fc is higher than the frequency f1, while the signal becomes the "L" level (0 V) when the carrier frequency fc is lower than the frequency f1. The signal to be inputted to the signal terminal 1006 becomes the "H" level (5 V) when the carrier frequency fc is higher than the frequency f2, while the signal becomes the "L" level (0 V) when the carrier frequency fc is lower than the frequency f2. Although the frequencies f0, f1 and f2 representative of the low, middle and high bands are expressed by f0=¼×fcmax, f1=½×fcmax and f2=¾×fcmax respectively here, the frequencies are not limited to such settings, but may be changed in accordance with the sizes of the frequency bands to be used.

(Dummy Load Circuit)

Figure 11:
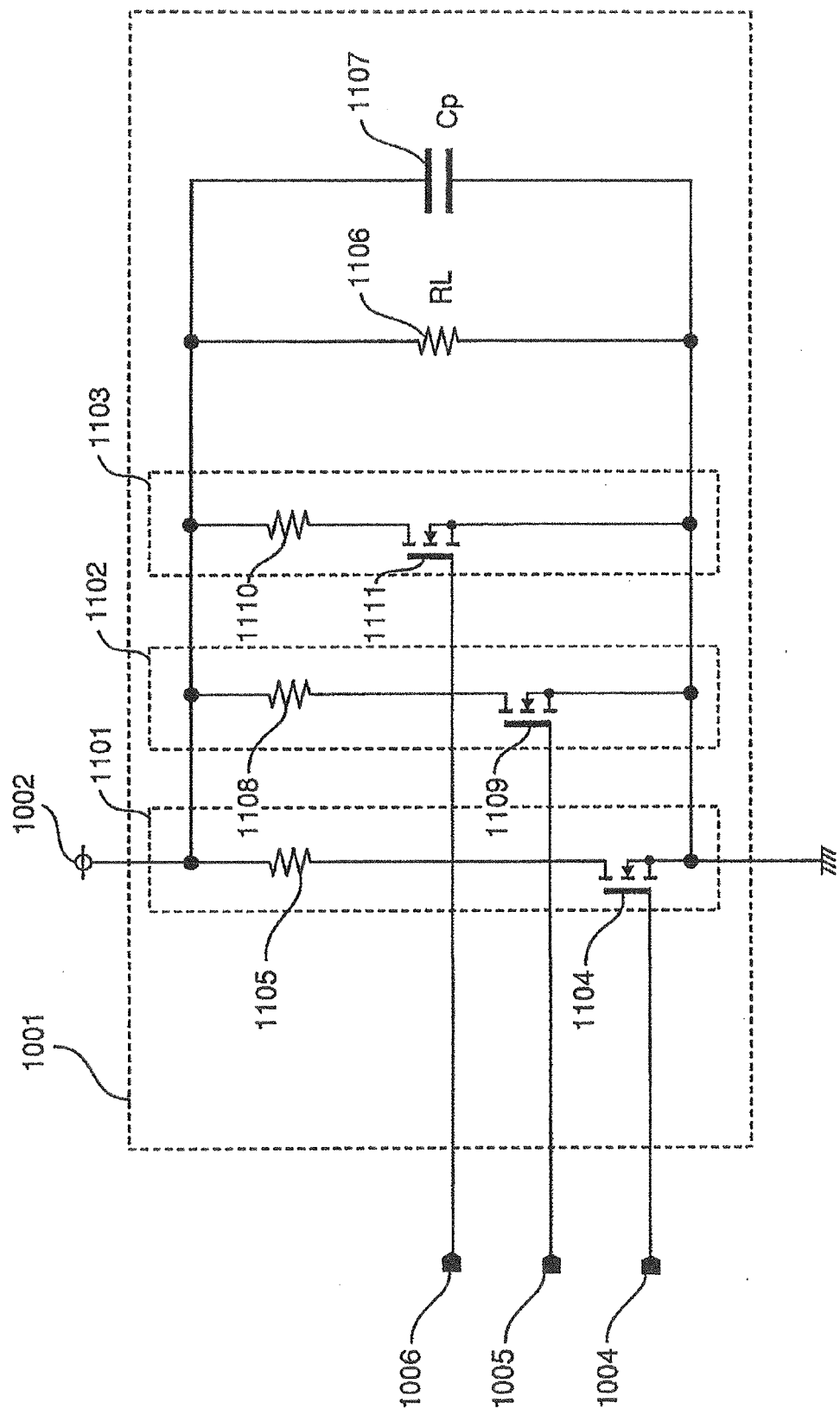
FIG. 11 is a circuit diagram of a dummy load circuit according to the third embodiment of the invention.

The dummy load circuit according to the third embodiment of the invention will be described with reference to FIG. 11. The dummy load circuit 1001 is constituted by switch-including DC load circuits 1101, 1102 and 1103 and a load resistance 1106. A bypass capacitor 1107 corresponds to the power supply bypass capacitor 560 of the gate drive circuit 106. It is desirable that the bypass capacitor 1107 is provided to have the same capacitance as that of the power supply bypass capacitor 560 placed in the gate drive circuit 106.

The load resistance 1106 simulates a DC current load of the gate drive circuit 106. The load resistance 1106 has a resistance value RL which allows a flow of current equal to a DC component of the current consumed by the gate drive circuit 106. Specifically, it is desirable that the resistance value RL is a resistance value between the gate drive IC positive electrode connection point 520 and the gate drive IC negative electrode connection point 530 in the gate drive IC 509 as represented in FIG. 5. In addition, it is more preferable that the power supply voltage between the gate drive IC positive electrode connection point 520 and the gate drive IC negative electrode connection point 530 at a carrier frequency of 0 Hz is actually measured, and the resistance value RL is experimentally adjusted to make the output voltage of the feedback output circuit agree with the carrier frequency dependency of the power supply voltage. The switch-including DC load circuit 1101 is constituted by a MOSFET 1104 and a resistance 1105 pulled up to the output node 1002 of the feedback output circuit. When the signal terminal 1004 reaches the "H" level, the MOSFET 1104 is turned ON to allow a flow of current from the output node 1002 of the feedback output circuit to the ground through the resistance 1105. The resistance 1105 has a resistance value high enough to allow a flow of current corresponding to the capacitance load current of the gate drive circuit at the carrier frequency fc=f0. The other switch-including DC load circuits 1102 and 1103 have the same configuration as the switch-including DC load circuit 1101. Resistances 1105, 1108 and 1110 have the same resistance value.

The dummy load circuit 1001 allows a flow of current only through the load resistance 1106 when the carrier frequency fc is in a very low range of 0<fc<f0. In addition to the load resistance 1106, the switch-including DC load circuit 1101 is turned ON in a low band range of f0<fc<f1 so as to allow a flow of current corresponding to the load current of the gate drive circuit at the carrier frequency fc=f0. In a middle band range of f1<fc<f2, the switch-including DC load circuit 1102 is turned ON in addition to the load resistance 1106 and the switch-including DC load circuit 1101 so as to allow a flow of current corresponding to the load current of the gate drive circuit at the carrier frequency fc=f1. Further, in a high band range of f2<fc<fcmax, all of the load resistance 1106 and the switch-including DC load circuits 1101, 1102 and 1103 are turned ON to allow a flow of current corresponding to the load current of the gate drive circuit at the carrier frequency fc=f2. In addition, the load capacitance 409 or 902 in the first or second embodiment is not present in the third embodiment. Thus, the dummy load circuit 1001 can be made smaller in size, leading to cost reduction of the power supply circuit. Further, the load current flowing in the dummy load circuit 1001 is outputted not by charging/discharging with the load capacitance 409 or 902 represented in FIG. 4 or FIG. 9 but only through the resistances 1105, 1108 and 1110. Thus, a ripple noise is prevented from appearing on the output voltage of the feedback output circuit 1003, so that stable control can be performed.

Although the resistances 1105, 1108 and 1110 are set to have the same resistance value, they may be set to have different values. Particularly when the resistance values of the resistances 1105, 1108 and 1110 are set at the ratio 1:2:4, the current can be varied in eight stages to support finer control. Thus, the reliability of feedback can be improved.

Assume that a switching signal actually outputted to a gate is outputted to the dummy load circuit as described above. When the duty ratio used for the PWM control is changed on this occasion, there is a possibility that the pulse width may be too narrow to be sensed. In that case, when the dummy load circuit 1001 receives information based on a switching signal with a duty ratio of 50% from the motor control board 302, there is no fear that the pulse cannot be sensed. Thus, the reliability of control can be improved further.

Based on the aforementioned contents, the dummy load circuit 1001 can output a signal about carrier frequency information from the motor control board 302 directly to the feedback output circuit. Even when the control system of the inverter 301 is changed to a two-phase modulation system, a load similar to that of the gate drive circuit 106 can be reproduced in accordance with the carrier frequency so that the reliability of feedback control can be improved. Thus, the load of the feedback output circuit may follow an actual load even when the carrier frequency increases and the load of the output circuit of the power supply circuit increases. Thus, the output voltage drop, that is, the gate voltage drop of each switching device can be suppressed when the carrier frequency increases, so that it is possible to suppress deterioration of power efficiency in the inverter. Further, the load current is outputted not by charging/discharging a capacitance by switching but through DC resistances. Thus, the ripple noise is prevented from appearing on the output voltage of the feedback output circuit, so that stable control can be performed.

Fourth Embodiment

Figure 12:
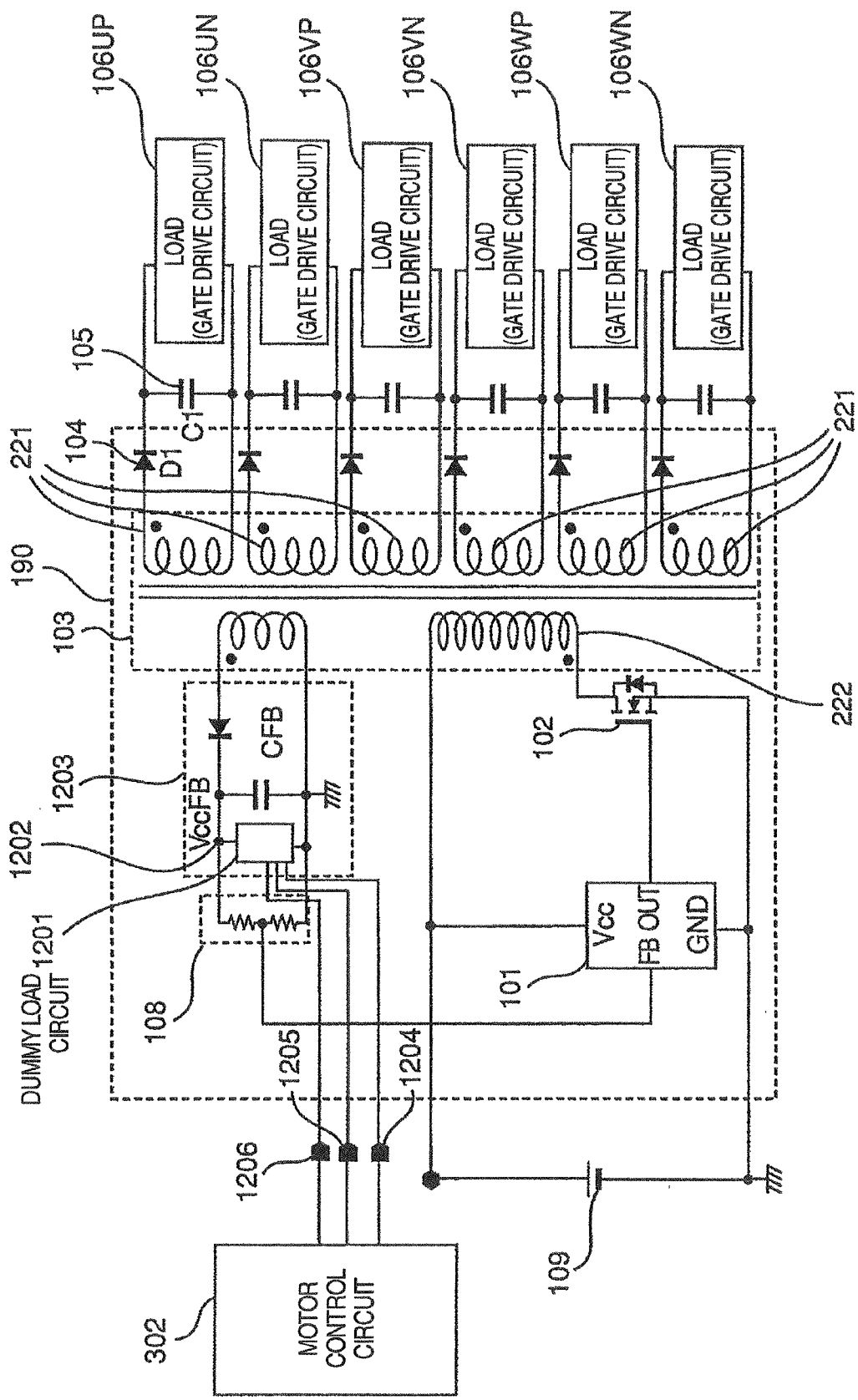
FIG. 12 is a circuit diagram of a power supply circuit according to a fourth embodiment of the invention.

FIG. 12 represents a fourth embodiment of the invention, whose fundamental configuration is similar to that of the third embodiment. The motor control circuit 302 transmits three-phase PWM signals to a dummy load circuit of a feedback output circuit 1203. For example, the motor control circuit 302 transmits a UN gate driving PWM signal 1204, a VN gate driving PWM signal 1205 and a WN gate driving PWM signal 1206 to the dummy load circuit of the feedback output portion 1203.

The dummy load circuit 1201 has three dummy load circuits 201 shown in the first embodiment. Three PWM signals can be inputted to the dummy load circuits 201 respectively. The dummy load circuits 201 share the load resistance 410 and the load capacitance 413 so as to simplify the circuit configuration. In a more specific configuration, the external input signal buffer 411, the driver 412 and a load capacitance 1304 are provided for the signal 1204. The load capacitance 1304 is ⅓ as high as the load capacitance 409 shown in FIG. 5 of the first embodiment. In the same manner, the signal level conversion circuit 411, the driver 412 and a load capacitance 1305, 1306 are provided for each signal 1205, 1206. The load capacitance 1305, 1306 is ⅓ as high as the load capacitance 409.

Based on the aforementioned contents, the dummy load circuit 1201 can output a signal about carrier frequency information from the motor control board 302 directly to the feedback output circuit. Even when the control system of the inverter 301 is changed to a two-phase modulation system, a load similar to that of the gate drive circuit 106 can be reproduced in accordance with the carrier frequency so that the reliability of feedback control can be improved. In addition, the load resistance 410 and the load capacitance 413 are shared in the dummy load circuit 1201 so that the configuration of the dummy load circuit 1201 can be simplified, and further the average load of the three phases U, V and W can be reproduced. Thus, the ripple noise on the output voltage of the feedback output circuit 1203 can be relaxed.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A power conversion device comprising:
an inverter circuit which converts DC power into AC power and which includes a plurality of switching devices constituting an upper arm and a lower arm;
a control circuit which controls the plurality of switching devices;
a drive circuit which drives the plurality of switching devices based on a signal from the control circuit; and
a power supply circuit which supplies power to the drive circuit; wherein:
the control circuit controls a power supply voltage to be outputted from the power supply circuit to the drive circuit;
the drive circuit drives the plurality of switching devices based on a carrier frequency and the power supply voltage;
the power supply circuit includes a transformer and a feedback output circuit, the transformer including a primary coil to which a voltage is supplied from a battery, and a plurality of secondary coils to which voltages are supplied through the primary coil respectively;
among the secondary coils, a first secondary coil outputs a voltage to the drive circuit;
among the secondary coils, a second secondary coil outputs a voltage to the feedback output circuit; and
the feedback output circuit includes a dummy load circuit which controls the voltage to be outputted to the primary coil based on a change of the carrier frequency.

2. A power conversion device according to claim 1, wherein:
the inverter circuit includes U-phase, V-phase and W-phase circuits being series circuits in each of which the upper arm and the lower arm are connected in series;
the drive circuit has a plurality of gate drive circuits corresponding to the upper arm and the lower arm forming the U-phase, V-phase and W-phase circuits, respectively;
the dummy load circuit includes a first switch unit, a second switch unit, a capacitor and a resistor;
the first switch unit and the second switch unit are connected in series to form a series circuit, the first switch unit being disposed on a higher potential side than the second switch unit;
the capacitor is connected in parallel with the second switch unit; and
the resistor is connected in parallel with the series circuit.

3. A power conversion device according to claim 2, wherein:
capacitance of the capacitor is substantially equal to capacitance of a capacitor connected in parallel between a gate and an emitter of one of the switching devices forming the inverter circuit.

4. A power conversion device according to claim 2, wherein:
a resistance value of the resistor is equal to a resistance value between a positive electrode connection point of each gate drive IC belonging to the drive circuit and a negative electrode connection point of the gate drive IC.

5. A power conversion device according to claim 3, wherein:
a resistance value of the resistor is equal to a resistance value between a positive electrode connection point of each gate drive IC belonging to the drive circuit and a negative electrode connection point of the gate drive IC.

6. A power conversion device according to claim 1, wherein:
the second secondary coil has a smaller number of turns than the primary coil.

7. A power conversion device according to claim 2, wherein:
the second secondary coil has a smaller number of turns than the primary coil.

8. A power conversion device according to claim 1, wherein:
a ratio between the number of turns of the primary coil and the number of turns of the second secondary coil is equal to a ratio between the voltage of the battery and the voltage for driving the switching devices.

9. A power conversion device according to claim 2, wherein:
a ratio between the number of turns of the primary coil and the number of turns of the second secondary coil is equal to a ratio between the voltage of the battery and the voltage for driving the switching devices.

10. A power conversion device according to claim 1, wherein:
the dummy load circuit includes a plurality of switching circuits and a first resistor, each of the switching circuits including a resistor and a switching device connected in series;
the first resistor is connected in parallel with the switching circuits; and the control circuit changes the number of switching circuits in which electric conduction should be secured, in accordance with a change of the carrier frequency.

11. A power conversion device according to claim 10, wherein:

the plurality of switching circuits include a first switching circuit, a second switching circuit and a third switching circuit;

the control circuit secures electric conduction in the first switching circuit when the carrier frequency is not lower than a first predetermined value, secures electric conduction in the first switching circuit and the second switching circuit when the carrier frequency is not lower than a second predetermined value, and secures electric conduction in the first switching circuit, the second switching circuit and the third switching circuit when the carrier frequency is not lower than a third predetermined value; and the first predetermined value is smaller than the second predetermined value, and the second predetermined value is smaller than the third predetermined value.

12. A power conversion device according to claim 2, wherein:

the feedback output circuit includes a plurality of dummy load circuits corresponding to the U-phase circuit, the V-phase circuit and the W-phase circuit, respectively.

13. A power conversion device according to claim 12, wherein:

information of the carrier frequency is outputted from the control circuit.

* * * * *